US012784818B2

(12) United States Patent
Watanabe et al.

(10) Patent No.: US 12,784,818 B2
(45) Date of Patent: Nov. 3, 2026

(54) CIRCUITS AND METHODS FOR REDUCING MEMORY POWER CONSUMPTION

(71) Applicant: Taiwan Semiconductor Manufacturing Company, Ltd., Hsinchu (TW)

(72) Inventors: Ryota Watanabe, Hsinchu City (TW); Hidemitsu Kojima, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 109 days.

(21) Appl. No.: 18/928,695

(22) Filed: Oct. 28, 2024

(65) Prior Publication Data

US 2026/0120756 A1 Apr. 30, 2026

(51) Int. Cl.
*G11C 5/14* (2006.01)
*G11C 11/418* (2006.01)
*G11C 11/419* (2006.01)

(52) U.S. Cl.
CPC .............. *G11C 11/418* (2013.01); *G11C 5/14* (2013.01); *G11C 11/419* (2013.01)

(58) Field of Classification Search
CPC ....... G11C 11/418; G11C 5/14; G11C 11/419; G11C 2207/2227; G11C 5/147; G11C 5/148; G11C 7/1045; G11C 7/22; G11C 7/222; G11C 8/06; G11C 8/12; G11C 8/18; G11C 11/408; G11C 11/4074; G06F 1/3275; G06F 1/0321; G06F 1/3287
USPC ........................................ 365/230.03, 230.06
See application file for complete search history.

(56) References Cited

U.S. PATENT DOCUMENTS

| | | | | |
|---|---|---|---|---|
| 8,767,497 | B2 * | 7/2014 | Marumoto | G11C 11/40615 365/230.03 |
| 8,861,301 | B2 * | 10/2014 | Ramamurthy | G11C 8/18 365/230.06 |
| 10,387,319 | B2 | 8/2019 | Adler et al. | |
| 2004/0114423 | A1 | 6/2004 | La | |

FOREIGN PATENT DOCUMENTS

| | | | |
|---|---|---|---|
| TW | 434570 | B | 5/2001 |
| TW | 201631478 | A | 9/2016 |

OTHER PUBLICATIONS

Office Action issued in Taiwan Appl. No. 114114274 dated Apr. 15, 2026.

* cited by examiner

*Primary Examiner* — Michael T Tran
(74) *Attorney, Agent, or Firm* — Foley & Lardner LLP

(57) ABSTRACT

A memory circuit includes a memory array including a plurality of memory cells, wherein a first portion of the memory array is accessed during a present cycle, and a second portion of the memory array is to be accessed during a next cycle. The memory circuit includes a decoder configured to provide a next address signal indicating an address of the second portion, and a memory controller operatively coupled to the memory array and the decoder. The decoder is configured to activate, based on the next address signal, the second portion during the present cycle, and cause, based on the next address signal, a third portion of the memory array to operate in a power management mode.

20 Claims, 14 Drawing Sheets

CIRCUITS AND METHODS FOR REDUCING MEMORY POWER CONSUMPTION

BACKGROUND

The semiconductor integrated circuit (IC) industry has experienced exponential growth. As ICs continue to scale down, more devices are integrated into the single chip. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
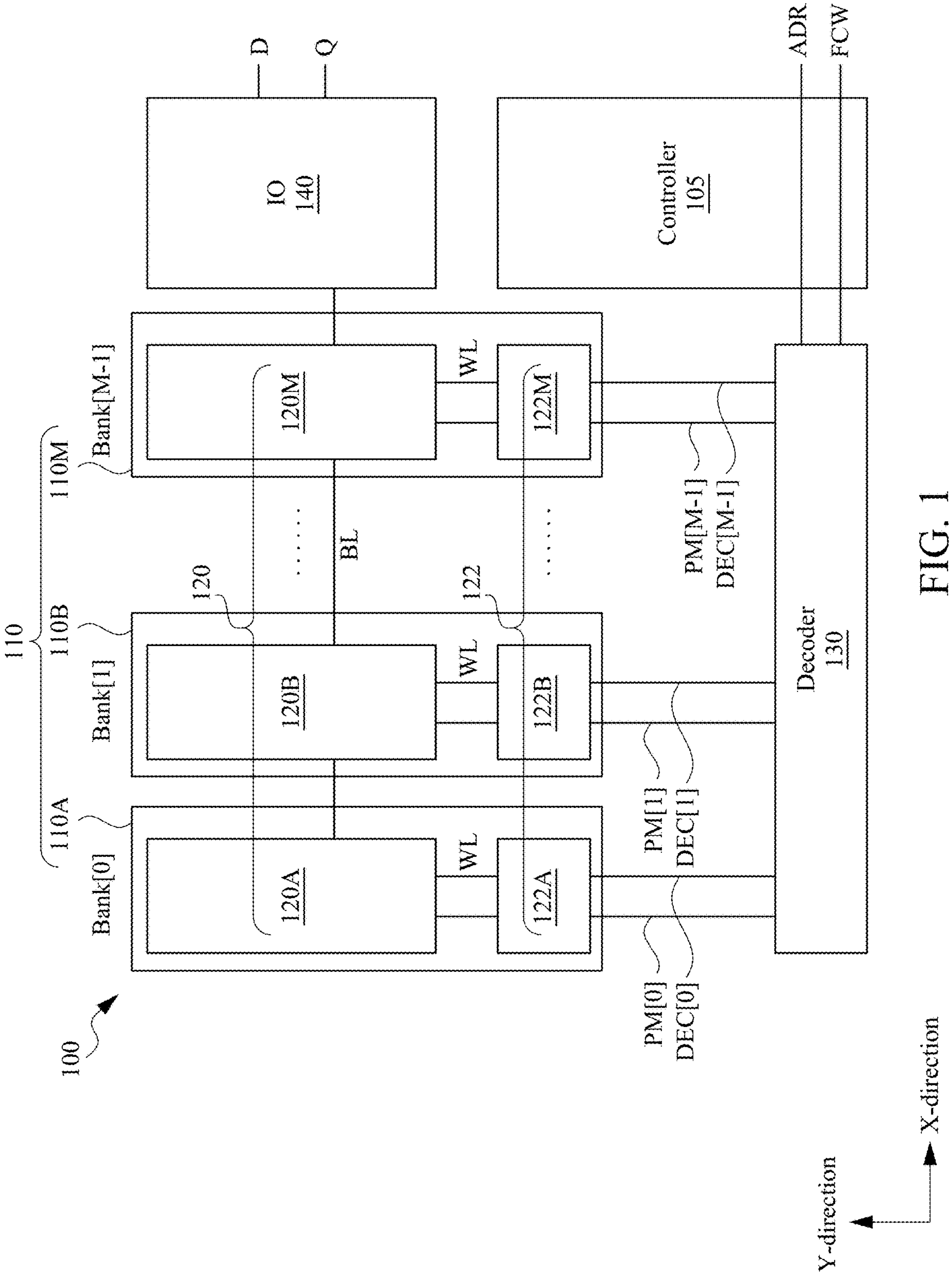
FIG. 1 depicts a block diagram of an example circuit in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A memory circuit is commonly used as a lookup table (LUT) in a numerically controlled oscillator (NCO), a digital synthesizer (DDS), etc., for generating waveforms. The LUT stores precomputed values of a waveform to generate various waveforms, while being operatively coupled with a phase accumulator. The phase accumulator can keep track of a current phase of the waveform, and continuously increments based on a frequency control word (FCW). The current value of the phase accumulator is used as an address to access the LUT, and the value retrieved from the LUT is then used to produce an output signal. By continuously updating the phase accumulator and reading from the LUT, a continuous waveform can be generated. While the LUT significantly improves the performance, power, and area (PPA) of such applications, the ever-increasing trend of scaling down the dimensions and sizes of the memory circuits disadvantageously affects the overall performance of the memory circuits, and, thus of these applications. Accordingly, there is a need to improve the performance of the memory circuits, such as reducing the power consumption of the memory circuits.

The present disclosure provides various embodiments of a memory circuit that can perform dynamic power management to optimize the power consumption. In some embodiments, the memory circuit can be configured to predict an address of a memory bank to be accessed during a next cycle (e.g., to occur after the present cycle), which allows only the to-be-accessed memory bank to be in a stand-by mode (while a memory bank is being accessed for a present cycle) during a present cycle while causing other memory banks (e.g., which are not to be accessed during the next cycle) in a power management mode. Further, in the power management mode, the other memory banks can remain deactivated while configured to be activated within one or more cycles. In some embodiments, the circuit can be further configured to receive a charge from a first memory bank, and then activate a second memory bank based on the charge received from the first memory bank, thereby reducing the power needed to activate the second memory bank. This provides a simple and flexible solution to effectively reduce the power consumption, while applicable for various memory devices (e.g., Read-Only Memories (ROMs), Random-Access Memories (RAMs), etc.).

In some embodiments, the circuit can be further configured to compare an address of a memory bank indicated in an address signal with an address of a memory bank being attempted to be accessed. In response to a detection of a mismatch between said two addresses, the circuit can be configured to resolve the mismatch. For example, the circuit can cause an input output (IO) interface to output a predetermined value, instead of an undetermined value. For example, the circuit can prioritize the address of the memory bank predicted with (e.g., indicated in) the address signal over the address of the attempted memory bank.

With the foregoing in mind, the figures and description below illustrate various examples of the circuits and processes to reduce the power consumption. It should be noted that the figures and description below are non-limiting examples and can be implemented as any of various other configurations while remaining within the scope of the present disclosure.

FIG. 1 depicts a block diagram of an example circuit 100 in accordance with some embodiments. The circuit 100 may be referred to as a memory device. The circuit 100 includes a memory controller 105, a memory array 120 (e.g., sub-arrays 120A, 120B, . . . , 120M), a word line driver (WLDV) 122 (e.g., WLDVs 122A, 122B, . . . , 122M) a decoder 130, and an input output (IO) interface 140. The circuit 100 can include a plurality of memory banks 110 (e.g., the memory banks 110A, 110B, . . . , 110M). Each of the memory banks 110 can include a corresponding sub-array of the memory array 120. It should be understood that the block diagram of FIG. 1 is a non-limiting example and simplified for illustrative purposes, and thus, the circuit 100 can include any of various other components or circuits, while remaining within the scope of the present disclosure. In some embodiments, the circuit 100 can include more, fewer, or different components than shown in or described with respect to FIG. 1.

The memory array 120 is a hardware component that stores data. In various embodiments, the memory array 120 is embodied as a semiconductor memory device. The memory array 120 includes a plurality of memory cells (or otherwise storage units). The memory array 120 includes a number of rows each extending in a first direction (e.g., the X-direction) and a number of columns each extending in a second direction (e.g., the Y-direction). Each of the rows and columns may include one or more conductive (e.g., metal) structures functioning as access lines. Each memory cell is arranged in the intersection of a corresponding row and a corresponding column, and can be operated according to voltages or currents through the respective conductive structures of the column and row. For example, each of the rows may include one or more corresponding word lines (WLs), and each of the columns may include one or more corresponding bit lines (BLs). In some examples, the memory array 120 may be or include ROMs, 6-transistor (6T) Static Random-Access Memory (SRAM), etc. In some examples, each of the columns may include one or more source lines (SLs).

The decoder 130 is a hardware component that can receive an address signal ADR indicating an address of a memory cell or a memory bank of the memory array 120 and assert a conductive structure (e.g., the WL, etc.) at that address. In some embodiments, the decoder 130 can be operatively connected to each bank with decoding signals (e.g., DEC[0], DEC[1], . . . . DEC[M−1], etc.), which can assert the respective WLs. The IO interface 140 is a hardware component that can access (e.g., read and write) each of the memory cells asserted through the decoder 130. For example, a first portion of the address, upon being decoded, can be sent to the IO interface 140 through the controller 105 to identify one or more bit lines (BLs) of the memory banks 110; and a second portion of the address, upon being decoded, can be sent to the WLDVs 122 to assert one or more word lines (WLs) of the memory banks 110. The IO interface 140 can be configured to manage input and output Q to and from the memory banks 110. In some embodiments, the IO interface 140 can include an input terminal D (e.g., Random Access Memories (RAMs)). In some embodiments, the input terminal D may be omitted (e.g., in Read-Only Memories (ROMs)).

The controller 105 is a hardware component that can control the coupled components (e.g., the memory banks 110, the memory array 120, the decoder 130, the IO interface 140, etc.). In some embodiments, the controller 105 can be operatively coupled with the decoder 130 (as shown) or include at least one decoder (not shown), and each of the memory banks 110 can be operatively coupled with the IO interface 140 and the decoder 130. The controller 105 can include a clock generator (or two clock generators, one configured for a read operation and the other configured for a write operation) to generate an internal clock (ICLK) signal. The ICLK signal can control the reading and writing to and from the memory cells of the memory banks 110.

It should be appreciated that the arrangements of the components shown in FIG. 1 is merely for illustrative purposes and does not limit the physical layout of these components. For example, although the IO interface 140 is shown as being arranged on a first side of the memory array 120, the IO interface 140 can include multiple sub-components or sub-circuits (e.g., one or more driver circuits, one or more pull-down circuits) physically disposed on different sides of the memory array 120, in accordance with various embodiments of the present disclosure. Further, such sub-components can be physically disposed between the decoder 130 and the memory array 120.

As disclosed herein, the circuit 100 can be configured to perform the dynamic power management to reduce the power consumption. When a first portion (e.g., the sub-array 120A) of the memory array 120 (or the memory bank 110A) is accessed during a present cycle, and a second portion (e.g., the sub-array 120B) of the memory array 120 (or the memory bank 110B) is to be accessed during a next cycle to occur after the present cycle, the circuit 100 can be configured to operate based on an address of the second portion predicted and/or determined during the present cycle.

In some embodiments, the decoder 130 can be configured to provide a next address signal indicating an address of a memory portion to be accessed during the next cycle (e.g., the address of the second portion), based on the address signal ADR and a frequency control word (FCW) signal FCW. In some embodiments, the FCW signal FCW can include data associated with the second portion. In some embodiments, the FCW signal FCW can include data associated with a plurality of portions of the memory array to be accessed during a plurality of next cycles. The decoder 130 can be configured to provide the next address signal based on various operations and/or functions. For example, the decoder 130 can generate the next address signal as any arbitrary function of the address signal ADR and the FCW signal FCW (e.g., the next address signal A_NEXT=f (the address signal ADR, the FCW signal FCW)). In some embodiments, as discussed with respect to FIG. 2A, the decoder 130 can include an adder (e.g., an arithmetic adder, a carry propagate adder, a carry-lookahead adder, a prefix adder, etc.), and the next address signal can be generated by adding the address signal ADR (e.g., of the present cycle) and the FCW signal.

In some embodiments, the decoder 130 can be configured to activate, based on the next address signal, the second portion during the present cycle. For example, the decoder 130 can be configured to enable, based on the next address signal, the second portion to operate in a stand-by mode during the present cycle, while the first portion is accessed during the present cycle. In some embodiments, the decoder 130 can be configured to cause, based on the next address signal, a third portion (e.g., the sub-array 120M) of the memory array 120 (or the memory bank 110M) to operate in a power management mode. In some embodiments, the decoder 130 can cause all the portions of the memory array 120, except for the first portion that is accessed during the present cycle and the second portion that is to be accessed during the next cycle, to operate in the power management mode. In some embodiments, the decoder 130 can be operatively coupled with the memory banks 110 through power management (PM) lines PM[0], PM[1], . . . , PM[M−1]. One or more of the PM control lines PM[0], PM[1], . . . , PM[M−1] can be asserted (e.g., based on operation of the controller 105 and/or the decoder 130) to operate one or more memory banks corresponding to the one or more of the PM control lines PM[0], PM[1], . . . , PM[M−1] in the power management mode.

In some embodiments, in the power management mode, the third portion of the memory array 120 can be deactivated. For example, the decoder 130 can deactivate the third portion of the memory array 120 based on the next address signal. In some embodiments, in the power management mode, the third portion of the memory array 120 can be activated within one or more cycles, in response to receiving an address signal indicating an address of the third portion. For example, when the first portion of the memory array 120 is accessed during an N−2-th cycle, and the predicted next address in the N−1-th cycle indicates the third portion to be accessed during an N-th cycle, the third portion in the power management mode can be activated during an N−1-th cycle or N-th cycle.

In some embodiments, the decoder 130 can be configured to turn off the power management mode based on a frequency of activation and deactivation. For example, the decoder 130 can be configured to turn off the power management mode of the third portion based on a frequency at which the third portion is activated and deactivated. The decoder 130 can turn off the power management mode of the third portion when the third portion is expected to be activated and deactivated frequently (e.g., the frequency of activation and deactivation is higher than a frequency threshold). In some embodiments, the next address signal can include a frequency threshold value below or above which the memory controller 105 or the decoder 130 is configured to turn off the power management mode.

In some embodiments, the decoder 130 can be configured to turn off the power management mode (e.g., to activate all banks) based on the FCW signal FCW. As a non-limiting example where at most two banks are awake in each cycle, a power consumption reduced by the power management mode can be indicated as:

$$-\frac{M-2}{M}P_{PM},$$

where $-P_{PM}$ is a power saving per one cycle when all banks are in the power management mode, and M is a number of the memory banks. An average power consumed to activate the memory bank can be indicated as:

$$1/\left(\frac{f_{clk}}{f_{OUT}}\right)P_{activate}\ \text{for}\left(\frac{f_{clk}}{f_{OUT}}>M\right),\ \text{and}$$

-continued $$\frac{1}{M}P_{activate}\ \text{for}\left(\frac{f_{clk}}{f_{OUT}}<M\right),$$

where $P_{activate}$ is the power consumption to activate a memory bank from the power management modes. Thus, the change in power consumption can be indicated as:

$$\Delta P=-\frac{M-2}{M}P_{PM}+\min\left(\frac{1}{\frac{f_{clk}}{f_{OUT}}},\frac{1}{M}\right)P_{activte}.$$

Here, $$\frac{f_{clk}}{fOUT}$$

can be indicated as $2^N$/FCW, and the change (e.g., total reduction) in power consumption can be based on the FCW signal FCW. That is, the decoder 130 can be configured to turn off the power management mode based on the FCW signal FCW. For example, the decoder 130 can be configured to turn off the power management mode when the FCW signal FCW has a value lower than a certain threshold value.

In some embodiments, the memory array 120 can be part of a numerical controlled oscillator (NCO) or a direct digital synthesizer (DDS). As disclosed herein, the circuit 100 can be thereby configured to perform the dynamic power management to reduce the power consumption in such applications as NCOs, DDSs, etc.

Figure 2B:
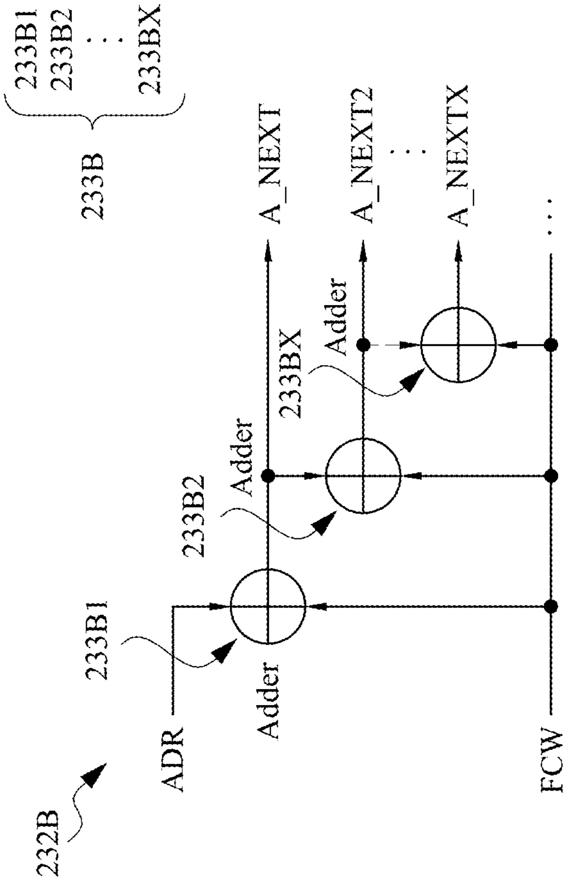
FIG. 2A and FIG. 2B depict block diagrams of example circuits in accordance with some embodiments.
Figure 2A:
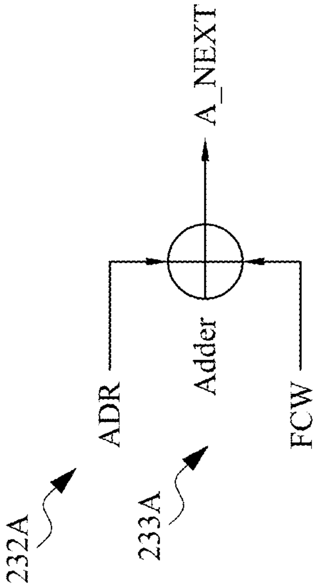

FIG. 2A and FIG. 2B depict block diagrams of example circuits 232A, 232B in accordance with some embodiments. In some embodiments, the circuits 232A, 232B can be included in or operatively coupled with the decoder 130. It should be understood that the block diagrams of FIG. 2A and FIG. 2B are non-limiting examples and simplified for illustrative purposes, and thus, can include any of various other components or circuits, while remaining within the scope of the present disclosure. In some embodiments, each of the circuits 232A, 232B can include more, fewer, or different components than shown in or described with respect to the figures.

Referring to FIG. 2A, the decoder 130 can include or operatively couple with the circuit 232A. In some embodiments, the circuit 232A can be or include an adder circuit 233A. In some embodiments, the adder circuit 233A can be or include an arithmetic adder, a carry propagate adder, a carry-lookahead adder, a prefix adder, etc. The adder circuit 233A can be configured to receive a first signal (e.g., the address signal ADR) indicating the address of the first portion (e.g., of the memory array 120) that is accessed during the present cycle. The adder circuit 233A can be configured to receive a second signal (e.g., the FCW signal FCW) associated with the second portion (e.g., of the memory array 120) that is to be accessed during the next cycle. The adder circuit 233A can be configured to provide a next address signal A_NEXT based on the first signal and the second signal. In response to receiving the address signal ADR and the FCW signal FCW, the adder circuit 233A can be configured to add the address signal ADR and the FCW signal FCW and then output the next address signal A_NEXT. The next address signal A_NEXT can indicate an address of the second portion. The decoder 130 can be configured to activate, based on the next address signal A_NEXT, the second portion during the present cycle, thereby causing the second portion to be in a stand-by mode and then to be accessed during the next cycle. The decoder 130 can be configured to cause, based on the next address signal A_NEXT, a third portion (e.g., of the memory array 120) that is not to be accessed during the next cycle, to operate in the power management mode.

Referring to FIG. 2B, in some embodiments, one or more portions of the memory array (e.g., which are to be accessed during the next cycle) can be activated during the present cycle. In some embodiments, a plurality of portions of the memory array (e.g., which are to be activated in a plurality of cycles) can be activated during the present cycle.

The decoder 130 can include or operatively couple with the circuit 232B. In some embodiments, the circuit 232B can be or include a plurality of adder circuits 233B. The plurality of adder circuits 233B can be or include an arithmetic adder, a carry propagate adder, a carry-lookahead adder, a prefix adder, etc. The adder circuit 233B can be configured to receive a first signal (e.g., the address signal ADR) indicating the address of the first portion (e.g., of the memory array 120) that is accessed during the present cycle. The adder circuit 233B can be configured to receive a second signal (e.g., the FCW signal FCW) associated with a plurality of portions (e.g., of the memory array 120) that are to be accessed during a plurality of next cycles. In some embodiments, the FCW signal FCW can include a plurality of signal portions associated with the plurality of portions of the memory array, respectively. In some embodiments, the adder circuit 233B can be configured to receive a plurality of second signals (e.g., a plurality of FCW signals FCW). The adder circuit 233B can be configured to provide a plurality of next address signals A_NEXT, A_NEXT2, . . . , A_NEXTX, based on the first signal and the second signal. In response to receiving the address signal ADR and the FCW signal FCW, the adder circuit 233B can be configured to add the address signal ADR and each signal portion of the FCW signal FCW, and then output the plurality of next address signals A_NEXT, A_NEXT2, . . . , A NEXTX. Each of the plurality of next address signals A_NEXT, A_NEXT2, . . . , A_NEXTX can indicate an address of a corresponding one of the plurality of portions of the memory array. The decoder 130 can be configured to activate, based on the plurality of next address signals A_NEXT, A_NEXT2, . . . , A_NEXTX, the corresponding portion of the memory array during a corresponding one of the plurality of next cycles, thereby causing the corresponding portion to be in a stand-by mode and then to be accessed during the corresponding next cycle.

In some embodiments, a first adder 233B1 of the adder circuit 233B can generate a first next address signal A_NEXT based on the address signal ADR and the FCW signal FCW. The first adder 233B1 can output a result of adding the address signal ADR and the FCW signal FCW (ADR+FCW) to a second adder 233B2. The second adder 233B2 can generate a second next address signal A_NEXT2 based on the FCW signal FCW and the next address signal A_NEXT received from the first adder 233B1. The second adder 233B2 can add the next address signal A_NEXT (ADR+FCW) and the FCW signal FCW, thereby outputting a second next address signal A_NEXT2 (ADR+2FCW). The second adder 233B2 can output a result of adding the second next address signal A_NEXT2 (ADR+2FCW) to a next adder (e.g., a third adder, not shown).

Referring to FIG. 2A and FIG. 2B, although depicted as including an adder circuit, the circuits 232A and 232B can include various logic components to output a next address signal as a function of the address signal ADR and the FCW signal FCW (e.g., f(ADR, FCW)). In some embodiments, the circuits 232A and 232B can include any logic components (e.g., a multiplier, a subtractor, a divider, a flip-flops, logic gates such as an AND, an OR, a NOT, an XOR, etc., a register, a counter, etc.) to output one or more next address signals as a function of the address signal ADR and the FCW signal FCW. This can thereby allow for generation of address signals and thus operation of the memory circuit in flexible manners.

Figure 3:
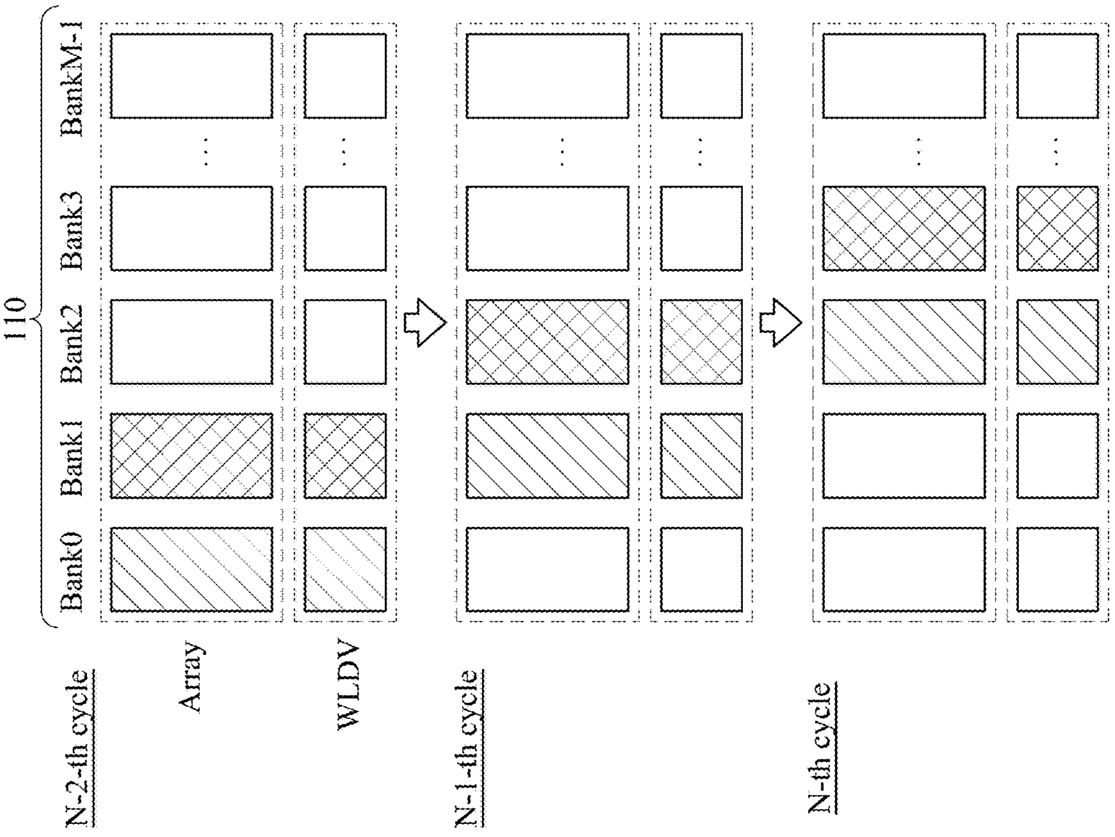
FIG. 3 depicts an example implementation associated with the circuit of FIG. 1 in accordance with some embodiments.

FIG. 3 depicts an example implementation associated with the circuit 100 of FIG. 1 in accordance with some embodiments. In some embodiments, shown in FIG. 3 are the memory banks 110. The memory banks 110 can include Bank 0, Bank 1, Bank 2, Bank 3, . . . , Bank M−1, each of which can include an array (e.g., the sub-arrays 120A, 120B, . . . , 120M) and a word line driver (WLDV) (e.g., the WLDVs 122A, 122B, . . . , 122M). It should be understood that the implementation shown in FIG. 3 is a non-limiting example and simplified for illustrative purposes, and thus, can include any of various other implementation or components, while remaining within the scope of the present disclosure. In some embodiments, the implementation shown in FIG. 3 can be performed with more, fewer, or different components than shown in or described with respect to the figures.

During an N−2-th cycle, while Bank 0 is accessed, the decoder 130 can be configured to provide a next address signal indicating an address of Bank 1 (e.g., which is to be accessed during an N−1-th cycle). The decoder 130 can activate, based on the next address signal, Bank 1 during the N−2-th cycle. The decoder 130 can deactivate, based on the next address signal, Bank 2, Bank 3, . . . , Bank M−1 (e.g., which are not to be accessed during the N−1-th cycle). Likewise, during the N−1-th cycle, while Bank 1 is accessed, the decoder 130 can be configured to provide a next address signal indicating an address of Bank 2 (e.g., which is to be accessed during an N-th cycle). The decoder 130 can activate, based on the next address signal, Bank 2 during the N−1-th cycle. The decoder 130 can deactivate, based on the next address signal, Bank 0, Bank 3, . . . , Bank M−1 (e.g., which are not to be accessed during the N-th cycle). During the N-th cycle, while Bank 2 is accessed, the decoder 130 can be configured to provide a next address signal indicating an address of Bank 3 (e.g., which is to be accessed during an N+1-th cycle; not shown). The decoder 130 can activate, based on the next address signal, Bank 3 during the N-th cycle. The decoder 130 can deactivate, based on the next address signal, Bank 0, Bank 1, Bank 4 (not shown), . . . , Bank M−1 (e.g., which are not to be accessed during the N+1-th cycle). By activating only a first memory bank that is accessed during a present cycle and a second memory bank that is to be accessed during a next cycle to occur after the present cycle, the power consumption of the memory circuit can be reduced.

While the circuits (e.g., the circuit 100) can be configured to reduce the power consumption based on a next address signal, the circuits disclosed herein can be configured to further reduce the power consumption based on charge recycling. The figures and description below illustrate various examples of the circuits and processes to reduce the power consumption based on the charge recycling. It should be noted that the figures and description below are non-limiting examples and can be implemented as any of various other configurations while remaining within the scope of the present disclosure.

Figure 4:
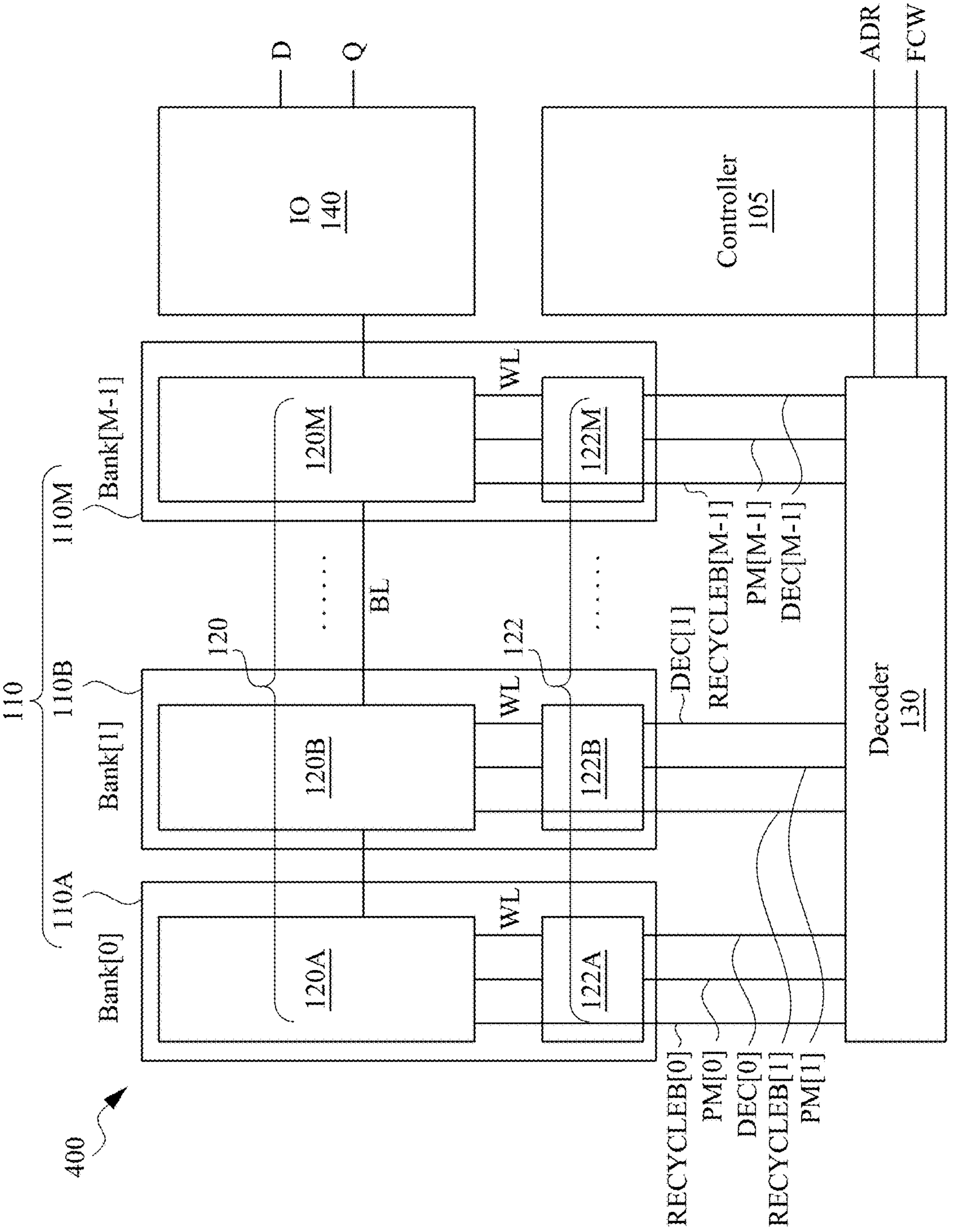
FIG. 4 depicts a block diagram of an example circuit in accordance with some embodiments.

FIG. 4 depicts a block diagram of an example circuit 400 in accordance with some embodiments. The circuit 400 can be substantially similar to or incorporate features of the circuit 100. In some embodiments, the circuit 400 can additionally include charge recycling lines RECYCLEB[0], RECYCLEB[1], . . . , RECYCLEB[M−1], as opposed to the circuit 100. It should be understood that the block diagram of FIG. 4 is a non-limiting example and simplified for illustrative purposes, and thus, can include any of various other components or circuits, while remaining within the scope of the present disclosure. In some embodiments, the circuit 400 can include more, fewer, or different components than shown in or described with respect to the figures.

Figure 5:
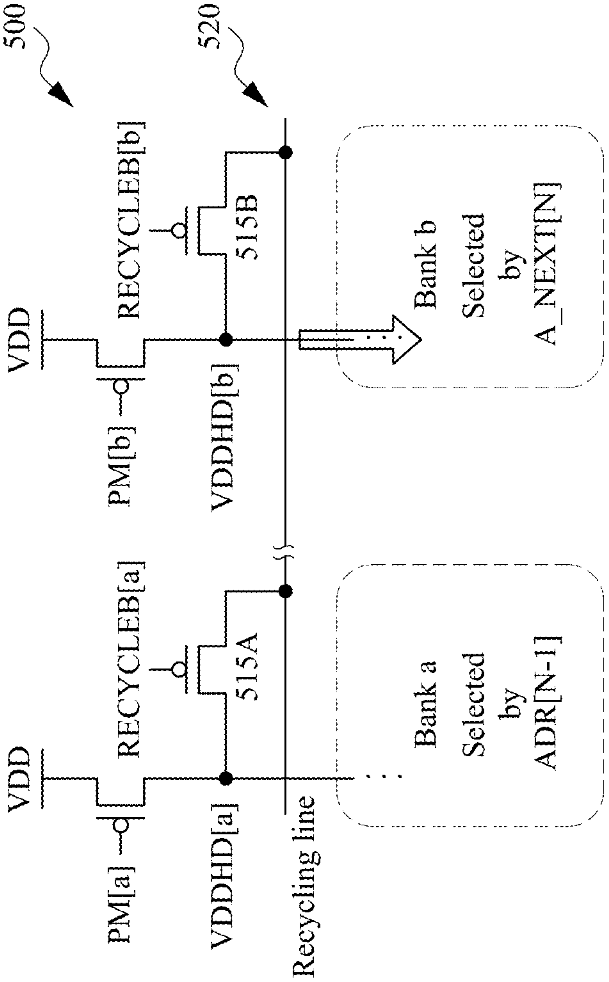
FIG. 5 depicts a block diagram of a portion of the circuit of FIG. 4 in which an example charge recycling circuit is included, in accordance with some embodiments.

The circuit 400 can include a charge recycling circuit (e.g., as shown in FIG. 5). In some embodiments, the charge recycling circuit can be included in or operatively coupled with the decoder 130. In some embodiments, the charge recycling circuit can be operatively coupled to the memory array 120 through the charge recycling lines RECYCLEB [0], RECYCLEB[1], . . . , RECYCLEB[M−1]. The charge recycling circuit can be configured to receive a charge from a first portion (e.g., the memory bank 110A) of the memory array 120 and provide the charge to a second portion (e.g., the memory bank 110B) of the memory array 120. The decoder 130 can be configured to activate the second portion based on the charge received from the first portion.

One or more of the charge recycling lines RECYCLEB [0], RECYCLEB[1], . . . , RECYCLEB[M−1] can be asserted (e.g., based on operation of the controller 105 and/or the decoder 130) to perform the charge recycling as discussed above on one or more memory banks corresponding to the one or more of the charge recycling lines RECYCLEB[0], RECYCLEB[1], . . . , RECYCLEB[M−1].

FIG. 5 depicts a block diagram of a portion of the circuit 400 in which an example charge recycling circuit 500 is included, in accordance with some embodiments. The portion of the circuit 400 shown in FIG. 5 includes a first memory bank ("Bank a") that is indicated in an address signal ADR[N−1] (e.g., accessed during a present cycle) and a second memory bank ("Bank b") that is indicated in a next address signal A_NEXT[N] (e.g., to be accessed during a next cycle to occur after the present cycle) connected with respective PM control lines PM[a] and PM[b] and respective charge recycling lines RECYCLEB[a] and RECYCLEB[b]. It should be understood that the block diagram of FIG. 5 is a non-limiting example and simplified for illustrative purposes, and thus, can include any of various other components or circuits, while remaining within the scope of the present disclosure. In some embodiments, the circuit 500 can include more, fewer, or different components than shown in or described with respect to the figures.

In some embodiments, the charge recycling circuit 500 can be included in or operatively coupled with the decoder 130. In some embodiments, the circuit 500 can include the charge recycling lines RECYCLEB[a], RECYCLEB[b], and a recycling line 520 (e.g., a conductive line). In some embodiments, as shown, the charge recycling circuit 500 can include a first transistor 515A including a gate terminal connected to the charge-recycling control line RECYCLEB [a], a first source/drain terminal connected to the virtual power line VDDHD[a], and a second source/drain terminal connected to the recycling line 520. The charge recycling circuit 500 can include a second transistor 515B including a gate terminal connected to the charge-recycling control line RECYCLEB[b], a first source/drain terminal connected to the virtual power line VDDHD[b], and a second source/drain terminal connected to the recycling line 520. In some embodiments, all the banks in the memory array 120 can share the recycling line 520. In some embodiments, the first transistor 515A can be an n-type MOSFET device. In some embodiments, the first transistor 515A can be a p-type MOSFET device. In some embodiments, the second transistor 515B can be an n-type MOSFET device. In some embodiments, the second transistor 515B can be a p-type MOSFET device.

The charge recycling circuit 500 can be configured to receive a charge from Bank a and provide the charge to Bank b through the recycling line 520. The decoder 130 can be configured to activate Bank b during the next cycle based on the charge received from Bank a. In some embodiments, the decoder 130 can select the charge-recycling control line RECYCLEB[a] (of Bank a that is accessed during the present cycle) and the charge-recycling control line RECYCLEB[b] (of Bank b that is to be accessed during the next cycle), thereby transferring the charge from VDDHD[a] to VDDHD[b]. In some embodiments, a time duration ta during which a recycling charge is collected from Bank a can be defined, with respect to the description and figures below.

In some embodiments, during an N→N+1 transition, a first portion of the memory array (e.g., specified in ADR[N]) is active and enters the PM mode, while a second portion of the memory (e.g., specified in A_NEXT[N+1]) in the PM mode becomes awake. The first portion of the memory array and the second portion of the memory can be coupled through the charge-recycling control line. For example, by transferring the charge from the first portion of the memory to the second portion of the memory, the charge can be recycled.

Figure 6B:
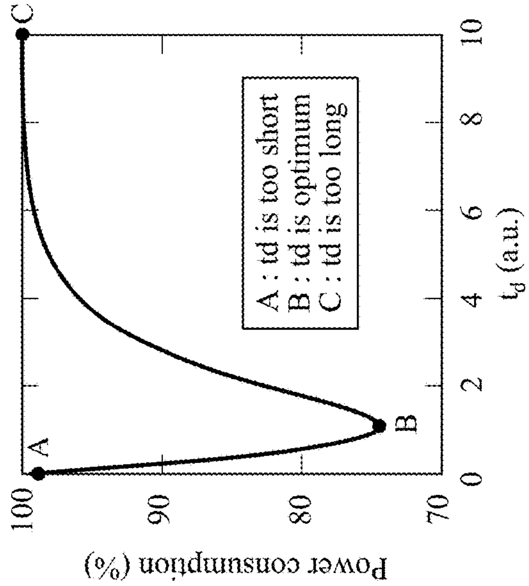
FIG. 6A, FIG. 6B, and FIG. 6C depict example waveforms associated with the charge recycling circuit of FIG. 5, in accordance with some embodiments.
Figure 6A:
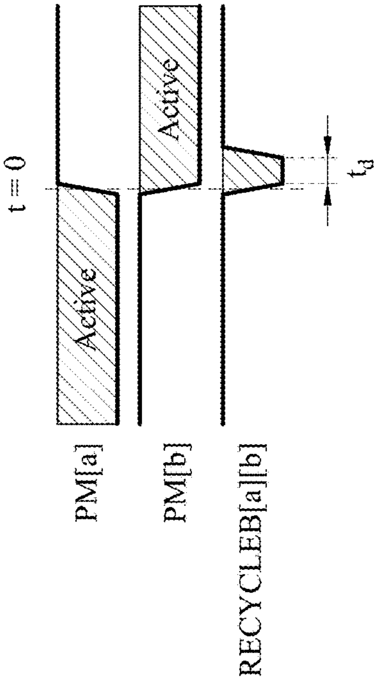
Figure 6C:
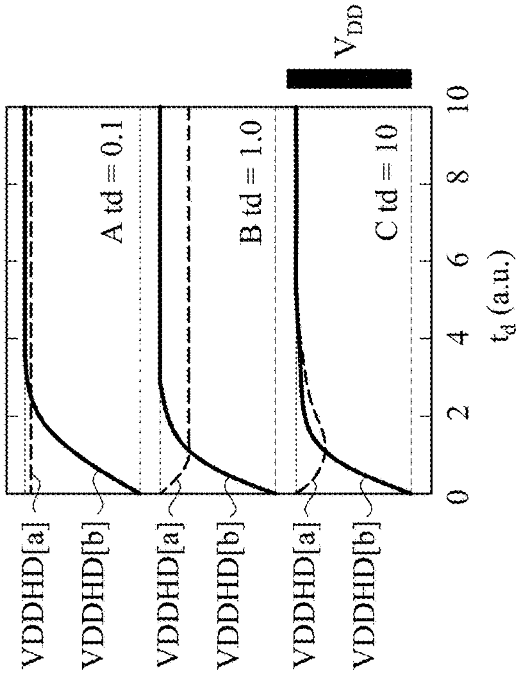

FIG. 6A, FIG. 6B, and FIG. 6C depict example waveforms associated with the charge recycling circuit 500, in accordance with some embodiments. Referring to FIG. 6A, before t=0, the PM control line PM[a] of Bank a is active, and after t=0, the PM control line PM[b] of Bank b is active. From t=0, for the time duration of ta, the recycling charge is transferred from the Bank a to the Bank b. FIG. 6B shows the power consumption as a function of the time duration ta, and FIG. 6C shows a power consumed to activate Bank b as a function of the time duration ta. When the time duration ta is too short (e.g., at A; e.g., $t_d$=0.1), the power consumed to activate Bank b (e.g., to raise VDDHD[b] to VDD for Bank b) does not use the charge (or uses less) from Bank a and thus does not reduce the power consumption (e.g., compared to the power consumption reduced with the time duration ta at B). When the time duration ta is too long (e.g., at C; e.g., $t_d$=10), although a portion of the charge from Bank a can be used to activate Bank b, the reused charge returns to Bank a, resulting in zero net gain in the power consumed to activate. At B, some of charge from Bank a can be reused, and Bank a can be isolated from being charged up again. Hereinafter, the time duration ta at or around B is referred to as a "recycling time." As discussed below with respect to FIG. 7A and FIG. 7B, in some embodiments, the charge recycling circuit 500 can include or operatively couple with a self-timer circuit configured to cause the charge recycling circuit 500 to transfer the recycling charge with a time duration of the recycling time.

Figure 7B:
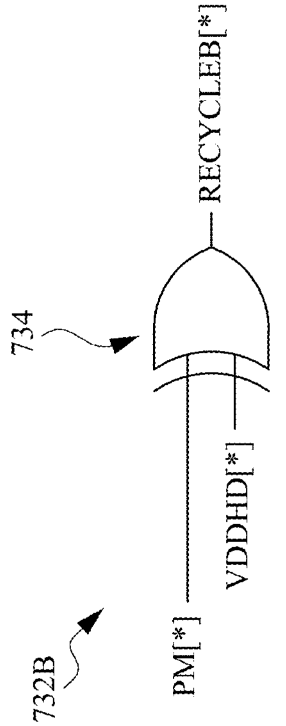
FIG. 7A and FIG. 7B depict block diagrams of example circuits in accordance with some embodiments.
Figure 7A:
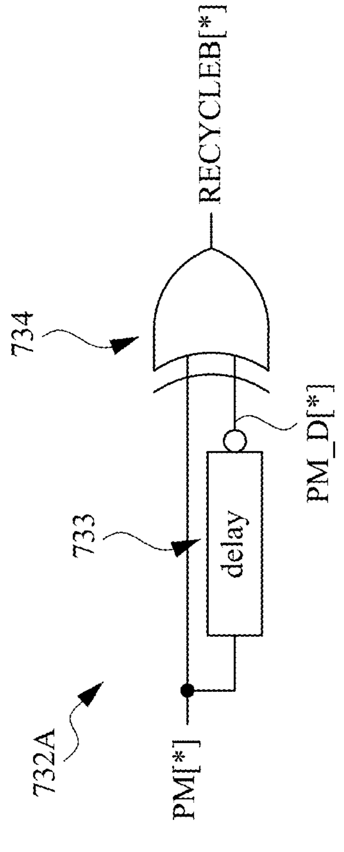

FIG. 7A and FIG. 7B depict block diagrams of example circuits 732A, 732B in accordance with some embodiments. In some embodiments, the circuits 732A, 732B can be included in or operatively coupled with the decoder 130, the charge recycling circuit 500, etc. It should be understood that the block diagrams of FIG. 7A and FIG. 7B are non-limiting examples and simplified for illustrative purposes, and thus, can include any of various other components or circuits, while remaining within the scope of the present disclosure. In some embodiments, each of the circuits 732A, 732B can include more, fewer, or different components than shown in or described with respect to the figures.

Referring to FIG. 7A, the memory bank 110A, 110B, . . . , 110M can include or operatively couple with the circuit 732A configured to cause the charge recycling circuit 500 to transfer the recycling charge with a time duration of the recycling time. In some embodiments, the circuit 732A can include a logic delay circuit 733 and a logic XOR gate 734. The logic delay circuit 733 can determine the recycling time. In some embodiments, the logic delay circuit 733 can include an odd number of inverters (e.g., an inverter chain). As shown, the logic delay circuit 733 can receive an input from the power management line PM[*] and output a delayed signal PM_D[*], which can be input to a first input of the logic XOR gate 734. The logic XOR gate 734 can receive the input from the power management line PM[*] through a second input, and then provide a result of the logic XOR operation to the charge recycling line RECYCLEB[*]. Based on the number of inverters in the logic delay circuit 733, the charge recycling circuit 500 can be allowed to transfer the recycling charge during the recycling time.

While the logic delay circuit 733 is discussed as a non-limiting example, the decoder 130 can include or operatively couple with various circuit components to delay the input from the power management line PM[*] and then to transfer the recycling charge with the time duration of the recycling time. In some embodiments, the decoder 130 can operatively couple with a capacitor, an inductor, a delay line, a delay circuit, etc., to provide the delayed signal PM_D[*].

Referring to FIG. 7B, the memory bank 110A, 110B, . . . , 110M can include or operatively couple with the circuit 732B configured to cause the charge recycling circuit 500 to transfer the recycling charge with a time duration of the recycling time. In some embodiments, the circuit 732B can include the logic XOR gate 734. As shown, the logic XOR gate 734 can receive VDDHD[*] through a first input, and receive an input from the power management line PM[*] through a second input. The logic XOR gate 734 can provide a result of the logic XOR operation to the charge recycling line RECYCLEB[*]. The VDDHD[*] can determine a rising edge of the charge recycling line RECYCLEB[*], thereby allowing for the transfer of the recycling charge for the recycling time.

In some embodiments, the decoder 130 can be configured to turn on the power management mode and deactivate the charge recycling circuit 500 (e.g., by not asserting or deselecting the charge recycling lines RECYCLEB[*]), based on a frequency of activation and deactivation. In some embodiments, the decoder 130 can be configured to turn on the power management mode and deactivate the charge recycling circuit 500 based on the FCW signal FCW. For example, the decoder 130 can be configured to turn on the power management mode and deactivate the charge recycling circuit 500 when the FCW signal FCW has a value lower than a certain threshold value. In some embodiments, the threshold value can be a predetermined fixed value.

The circuit disclosed herein can be configured to detect a "prediction failure" of the attempted address ADR (e.g., as shown in FIG. 1). As used herein, the "prediction failure" can cause the output Q including an 'x' state or discontinuity. For example, when the FCW signal FCW changes from a first value to a second value, there may be mismatch between ADR[n] and A_NEXT[n−1]. With the mismatch in ADR[n] and A_NEXT[n−1], the memory attempts to access not-ready bank, which can be included in the "prediction failure". The circuit (e.g., the circuit 100 or the circuits as discussed below) can be configured to detect and/or address the prediction failure. In some embodiments, the circuit can be configured to set the output Q to a fixed value (e.g., "00 . . . 0") or determine the output from the next address signal in a previous cycle to prevent discontinuity. The figures and description below illustrate various examples of the circuits and processes to detect and/or address the prediction failure. It should be noted that the figures and description below are non-limiting examples and can be implemented as any of various other configurations while remaining within the scope of the present disclosure.

Figure 8A:
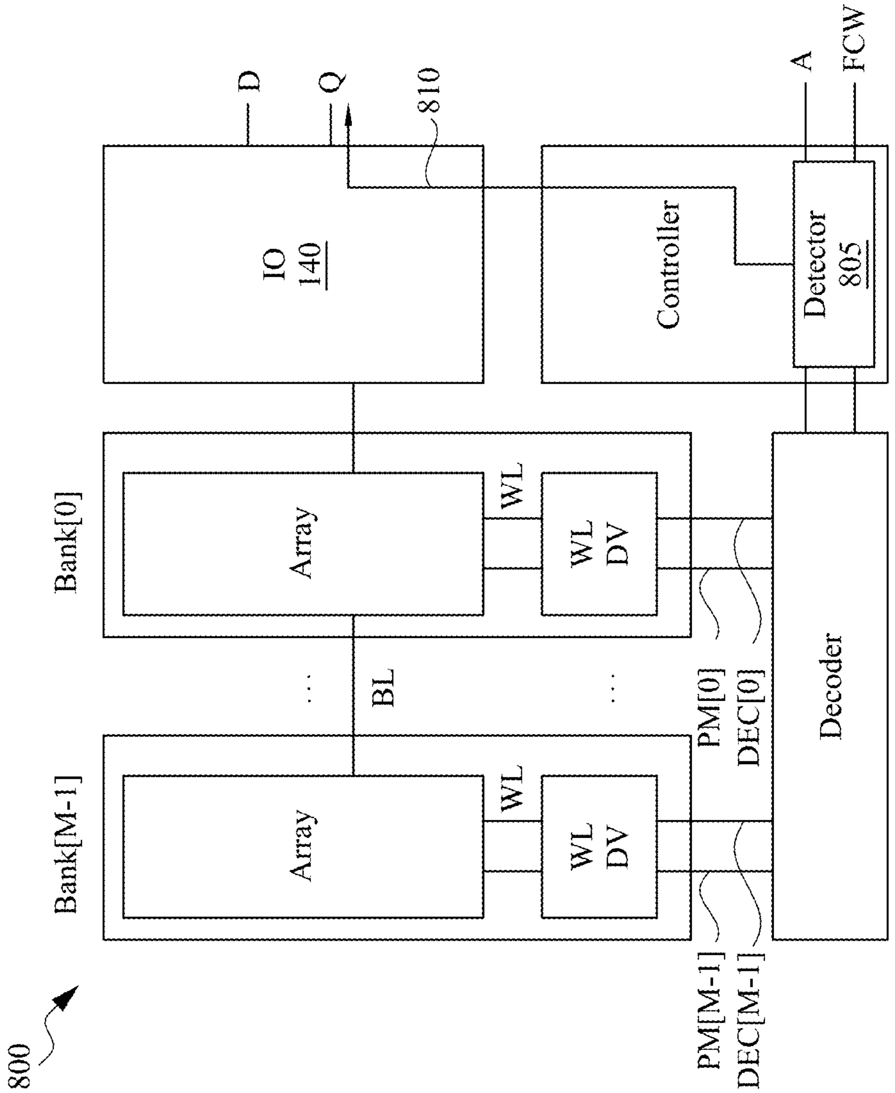
FIG. 8A, FIG. 8B and FIG. 8C depict block diagrams of an example circuit in accordance with some embodiments.
Figure 8B:
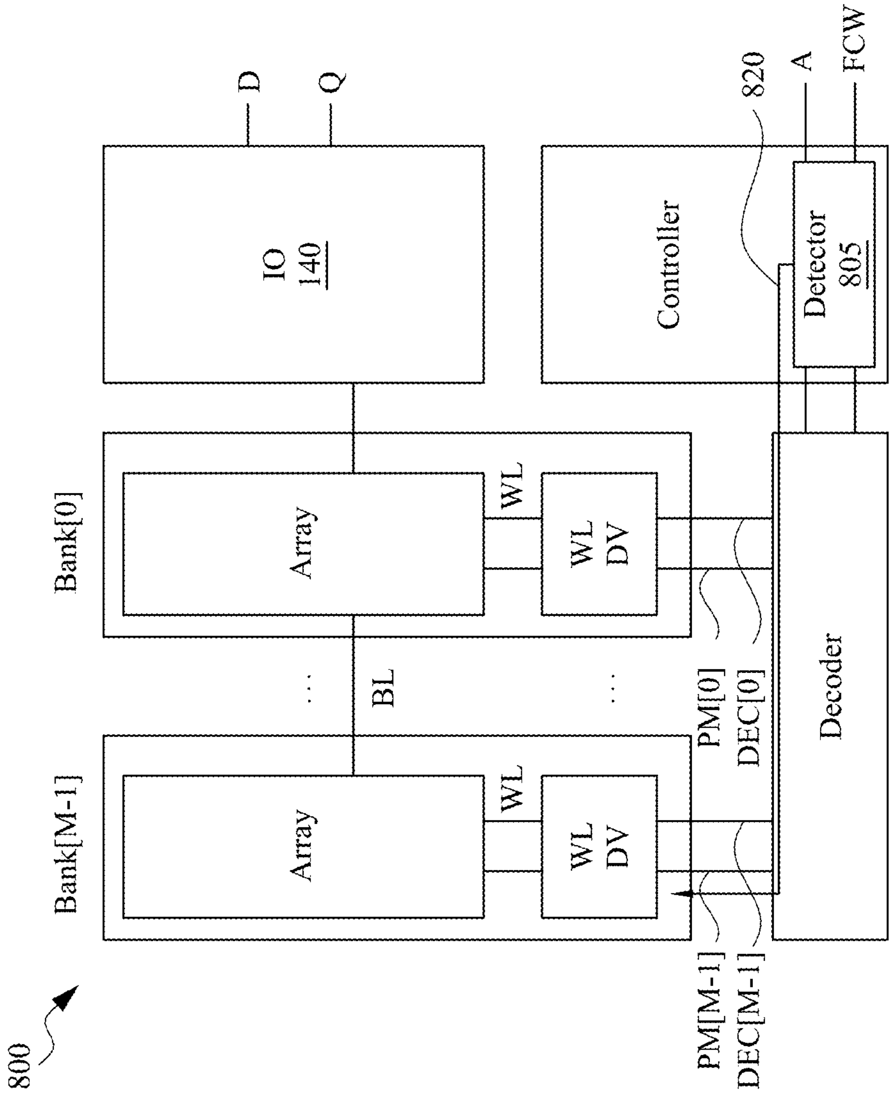

FIG. 8A and FIG. 8B depict block diagrams of an example circuit 800 in accordance with some embodiments. More specifically, FIG. 8A shows the circuit 800 to perform an example implementation, and FIG. 8B shows the circuit 800 to perform another example implementation. The circuit 800 can be substantially similar to or incorporate features of the circuit 100, the circuit 400, etc. In some embodiments, the circuit 800 can additionally include a detector circuit 805, as opposed to the circuit 100, the circuit 400. It should be understood that the block diagrams of FIG. 8A and FIG. 8B are non-limiting examples and simplified for illustrative purposes, and thus, can include any of various other components or circuits, while remaining within the scope of the present disclosure. In some embodiments, the circuit 800 can include more, fewer, or different components than shown in or described with respect to the figures. In some embodiments, although not shown, the circuit 800 can additionally include the detector circuit 805 as opposed to the circuit 400 including the recycling lines, charge recycling circuits, etc.

In some embodiments, the detector circuit 805 can include a logic circuit configured to compare the address of the second portion (e.g., which is to be accessed during the next cycle) indicated in the next address signal with an address of an attempted memory portion of the memory array (as used herein, the "attempted memory portion" is a memory portion being attempted to be accessed during the next cycle). In some embodiments, the detector circuit 805 can be configured to compare an address signal (e.g., ADR) of a memory portion to be accessed during a next cycle to occur after the present cycle, with a next address signal (e.g., A_NEXT) indicating the memory portion. For example, the address signal ADR (e.g., at t=N) can be compared with the next address signal A_NEXT (e.g., at t=N−1).

In some embodiments, the logic circuit can be or include a comparator. For example, the comparator can receive the address of the second portion (e.g., which is to be accessed during the next cycle) indicated in the next address signal and the address of the attempted memory portion. The comparator can output a result of a comparison therebetween, and can provide a signal indicating the prediction failure in response to a detection of a mismatch (e.g., an 'x' state, discontinuity, etc.) in the result.

Referring to FIG. 8A, the detector circuit 805 can be configured to, in response to the detection of the mismatch, cause the IO interface 140 to output a predetermined value as an output Q. In some embodiments, the detector circuit 805 can send a signal 810 to the IO interface 140, thereby causing the IO interface 140 to output a fixed state (e.g., "00 . . . 0") as the output Q to address a prediction failure.

For example, the detector circuit 805 can cause the IO interface 140 to output "00 . . . 0" instead of the 'x' state.

In some cases, the attempted memory portion may be consistent with neither of the memory portion indicated in the next address signal A_NEXT (e.g., at t=N−1) or the memory portion indicated in the address signal ADR (e.g., at t=N−1). In some embodiments, the detector circuit 805 can be configured to compare the address indicated in the address signal ADR and/or the address indicated in the next address signal A NEXT with the address of the attempted memory portion. For example, the address indicated in the address signal ADR (e.g., at t=N−1) and the address indicated in the next address signal A_NEXT (e.g., at t=N−1) can be compared with the address of the attempted memory portion. The detector circuit 805 can output a result of a comparison therebetween, and can provide a signal indicating the prediction failure in response to a detection of a mismatch (e.g., when the address of the attempted memory portion is not consistent with the address indicated in the address signal ADR and/or the address indicated in the next address signal A_NEXT) in the result. As shown in FIG. 9B, the circuit 800 of FIG. 8A can be configured to address the prediction failure by accessing the next address signal A_NEXT in the previous cycle instead of the address signal ADR in the present cycle, as shown, thereby preventing the 'x' state or discontinuity in the output Q.

Referring to FIG. 8B, the detector circuit 805 can be configured to, in response to the detection of the mismatch, prioritize the address of the second portion (e.g., indicated in the address signal ADR and/or indicated in the next address signal A_NEXT) over the address of the attempted memory portion. The detector circuit 805 can include a logic circuit configured to compare the address indicated in the next address signal with an address of the attempted memory portion of the memory array. In some embodiments, the detector circuit 805 can be configured to compare the address signal (e.g., ADR) of the memory portion to be accessed during the next cycle to occur after the present cycle, with the next address signal (e.g., A_NEXT) indicating the memory portion. For example, the address signal ADR (e.g., at t=N) can be compared with the next address signal A_NEXT (e.g., at t=N−1). The detector circuit 805 can include a comparator. For example, the comparator can receive the address (e.g., which is to be accessed during the next cycle) indicated in the next address signal and the address of the attempted memory portion. The comparator can output a result of a comparison therebetween to detect a mismatch. In response to a detection of the mismatch, the detector circuit 805 can control the decoder 130 to access the memory bank specified in the address signal A_NEXT[N−1].

Figure 8C:
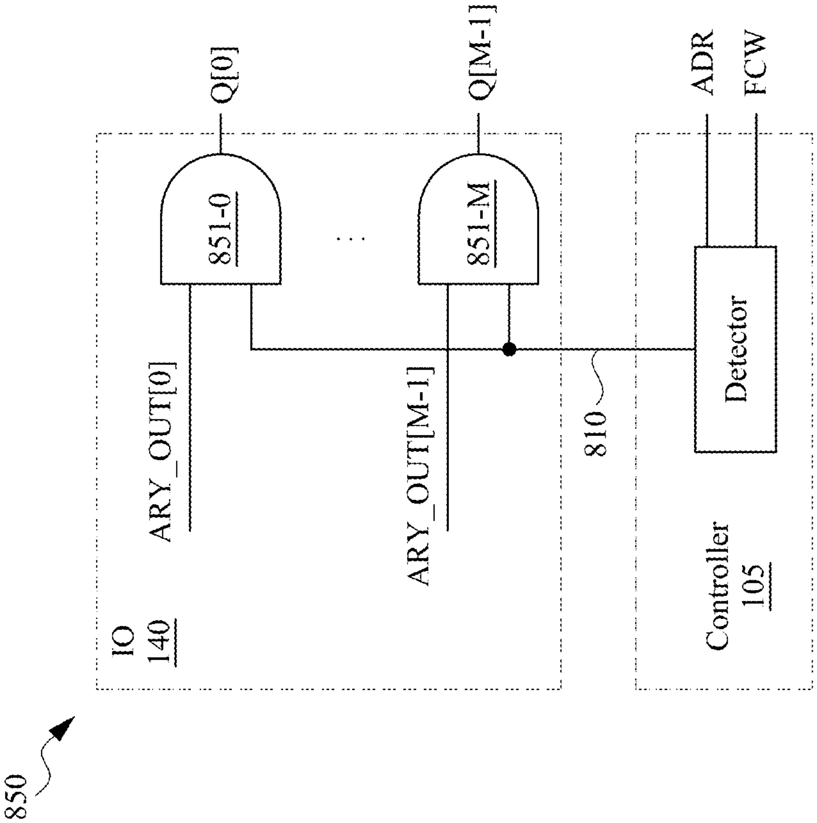

FIG. 8C depicts a block diagram of an example circuit 850 in accordance with some embodiments. More specifically, the circuit 850 shown in FIG. 8C is an example portion included in the circuit 800 of FIG. 8A. It should be understood that the block diagram of FIG. 8C is a non-limiting example and simplified for illustrative purposes, and thus, can include any of various other components or circuits, while remaining within the scope of the present disclosure. In some embodiments, the circuit 850 can include more, fewer, or different components than shown in or described with respect to the figures.

The circuit 850 can include a plurality of logic components 851-0, . . . , 851-M. The plurality of logic components 851-0, . . . , 851-M can receive the signal 810 from the controller 105 and respective BL data ARY_OUT[0], . . . , ARY_OUT[M−1]. In response to receipt of the signal 810 and the BL data, the plurality of logic components 851-0, . . . , 851-M can be configured to output the output Q[0], . . . , Q[M−1]. If the mismatch is absent, the signal 810 can be kept at a first logic state (e.g., H level) and the output Q[*] can be equal to ARY_OUT[*]. When the detector detects the mismatch, the signal 810 can be set to a second logic state (e.g., L level) and the output Q[*] can be sent to the second logic state (e.g., L level; such as "00 . . . 0").

Figure 9C:
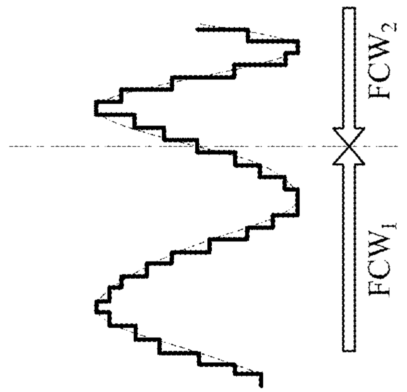
FIG. 9A, FIG. 9B, and FIG. 9C depict example waveforms associated with the circuit of FIG. 8A to FIG. 8C, in accordance with some embodiments.
Figure 9B:
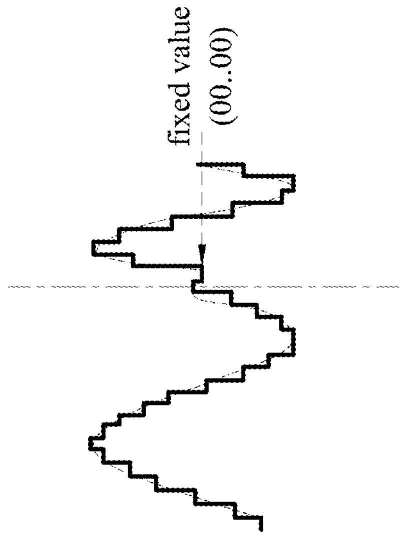
Figure 9A:
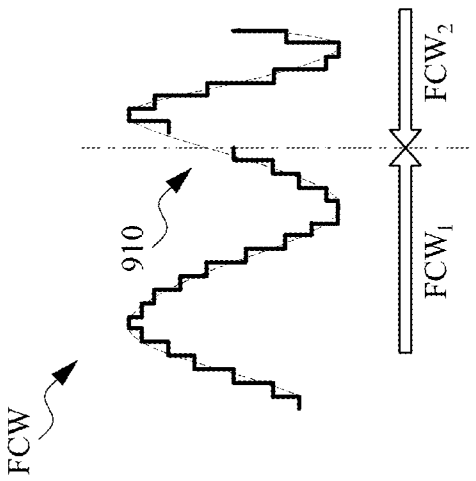

FIG. 9A, FIG. 9B, and FIG. 9C depict example waveforms associated with the circuit 800, in accordance with some embodiments. The waveform in FIG. 9A shows the output Q when a FCW signal FCW changes from a first signal portion FCW1 to a second signal portion FCW2. During a frequency switch, as shown, the output signal Q can include a signal portion 910, which indicates a 'x' state or discontinuity caused by prediction failure. The detector circuit 805 can detect a mismatch (e.g., when the address of the attempted memory portion is not consistent with the address indicated in the address signal ADR and/or the address indicated in the next address signal A_NEXT) that can result in the signal portion 910 and then can address the signal portion 910 as discussed herein. Referring to FIG. 9B, the circuit 800 can be configured to address the prediction failure by outputting the fixed value (e.g., 00 . . . 0) as the output Q to prevent the 'x' state. Referring to FIG. 9C, the circuit 800 can be configured to address the prediction failure by determining the output for a next cycle (e.g., to occur after the present cycle) from the next address signal in a present cycle to prevent the 'x' state or discontinuity.

The circuits (e.g., the circuits 100, 400, 800, etc.) as disclosed herein can be utilized in various applications, including but not limited to numerical controlled oscillators (NCOs), direct digital synthesizers (DDSs), etc. The figures and description below illustrate various example applications to utilize the circuits. It should be noted that the figures and description below are non-limiting examples and can be implemented as any of various other configurations while remaining within the scope of the present disclosure.

Figure 10A:
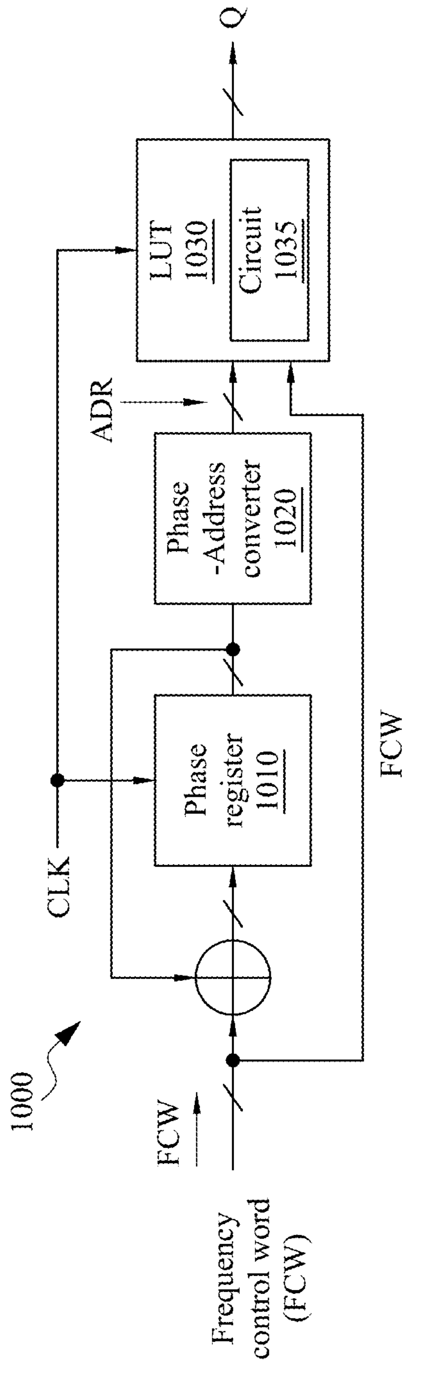
FIG. 10A depicts a block diagram of an example NCO circuit, in accordance with some embodiments.
Figure 10B:
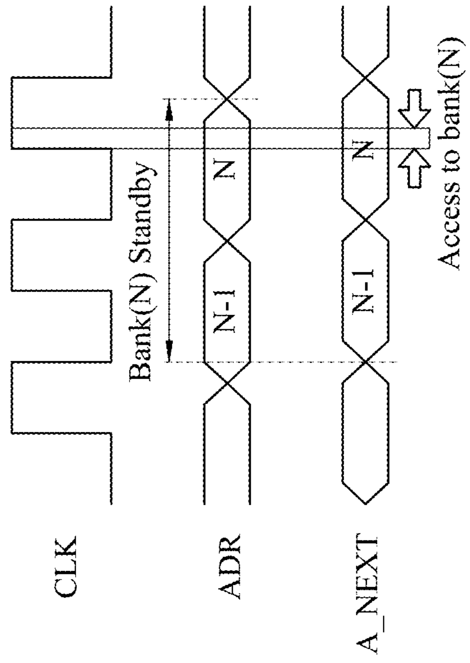
FIG. 10B depicts example waveforms associated with the NCO circuit, in accordance with some embodiments.

FIG. 10A depicts a block diagram of an example NCO circuit 1000, in accordance with some embodiments. The NCO circuit 1000 can include a phase register 1010, a phase-address converter 1020, and a look-up table (LUT) 1030. It should be understood that the block diagram of FIG. 10A is a non-limiting example and simplified for illustrative purposes, and thus, can include any of various other components or circuits, while remaining within the scope of the present disclosure. In some embodiments, the NCO circuit 1000 can include more, fewer, or different components than shown in or described with respect to the figures. FIG. 10B depicts example waveforms associated with the NCO circuit 1000, in accordance with some embodiments. The waveforms of FIG. 10B includes a clock signal CLK, an address signal ADR, and a next address signal A_NEXT.

In some embodiments, the LUT 1030 can include a circuit 1035 (e.g., the circuit described with respect to FIG. 1 to FIG. 8C). For example, the LUT 1030 can include the circuit 100, the circuit 400, or the circuit 800. As shown, a FCW signal FCW can be provided to the phase register 1010 and the LUT 1030 (e.g., the circuit 1035). The phase-address converter 1020 can receive the FCW signal FCW through the phase register, by converting an accumulated phase in the phase register 1010 to an address of a memory portion. The phase-address converter 1020 can provide an address signal ADR indicating the address of the memory portion to the LUT 1030 (e.g., the circuit 1035). The circuit 1035, in response to receiving the address signal ADR, can generate a next address signal A_NEXT based on the address signal ADR and the FCW signal FCW, as discussed above. The LUT 1030 can provide an output Q based on the address signal ADR.

As discussed above and referring to FIG. 10B, the circuit 1035 can be configured to perform the dynamic power management to reduce the power consumption. Operating only the to-be-accessed memory bank (e.g., Bank N) in a stand-by mode during a present cycle (in which a present memory bank (e.g., Bank N−1) is being accessed) based on the address signal ADR and the next address signal A_NEXT can reduce the power consumption associated with the NCO circuit 1000.

Figure 11A:
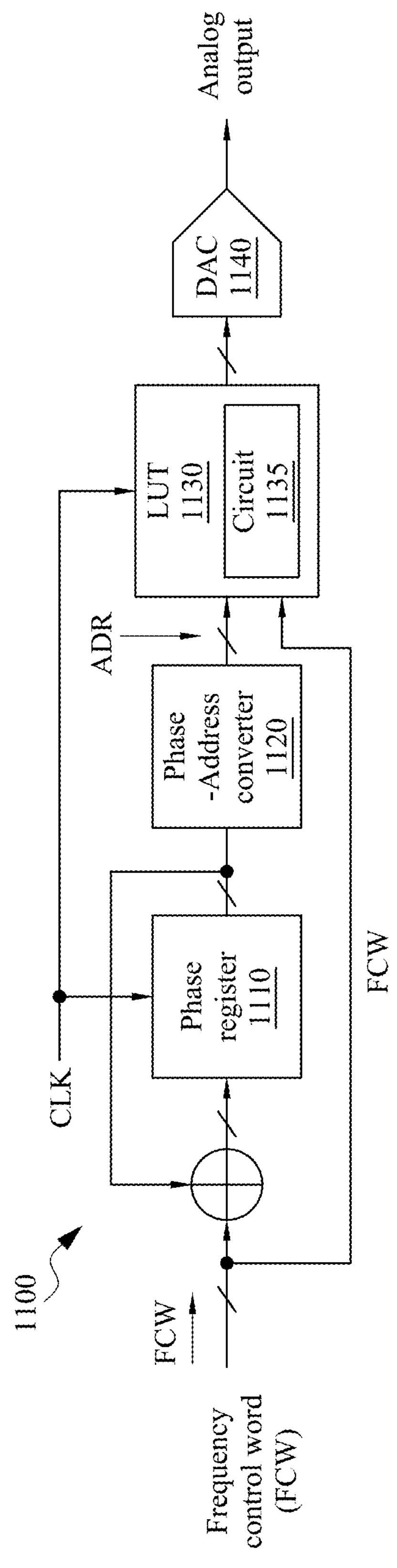
FIG. 11A depicts a block diagram of an example DDS circuit, in accordance with some embodiments.
Figure 11B:
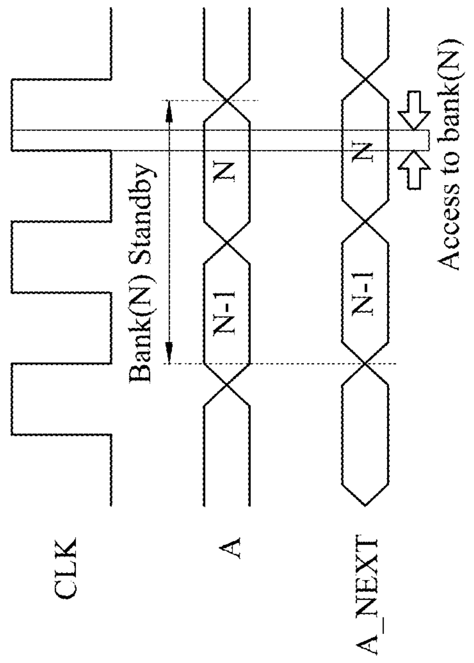
FIG. 11B depicts example waveforms associated with the DDS circuit, in accordance with some embodiments.

FIG. 11A depicts a block diagram of an example DDS circuit 1100, in accordance with some embodiments. The DDS circuit 1100 can include a phase register 1110, a phase-address converter 1120, a look-up table (LUT) 1130, and a digital-analog converter (DAC) 1140. It should be understood that the block diagram of FIG. 11A is a non-limiting example and simplified for illustrative purposes, and thus, can include any of various other components or circuits, while remaining within the scope of the present disclosure. In some embodiments, the DDS circuit 1100 can include more, fewer, or different components than shown in or described with respect to the figures. FIG. 11B depicts example waveforms associated with the DDS circuit 1100, in accordance with some embodiments. The waveforms of FIG. 11B includes a clock signal CLK, an address signal ADR, and a next address signal A_NEXT.

In some embodiments, the LUT 1130 can include a circuit 1135 (e.g., the circuit described with respect to FIG. 1 to FIG. 8C). For example, the LUT 1130 can include the circuit 100, the circuit 400, or the circuit 800. As shown, a FCW signal FCW can be provided to the phase register 1110 and the LUT 1130 (e.g., the circuit 1135). The phase-address converter 1120 can receive the FCW signal FCW through the phase register, by converting an accumulated phase in the phase register 1110 to an address of a memory portion. The phase-address converter 1120 can provide an address signal ADR indicating the address of the memory portion to the LUT 1130 (e.g., the circuit 1135). The circuit 1135 can, in response to receiving the address signal ADR, can generate a next address signal A NEXT based on the address signal ADR and the FCW signal FCW, as discussed above. The LUT 1130 can provide an output based on the address signal ADR to the DAC 1140. The DAC 1140 can covert the output received from the LUT 1130 to an analog output.

As discussed above and referring to FIG. 11B, the circuit 1135 can be configured to perform the dynamic power management to reduce the power consumption. Operating only the to-be-accessed memory bank (e.g., Bank N) in a stand-by mode during a present cycle (in which a present memory bank (e.g., Bank N−1) is being accessed) based on the address signal ADR and the next address signal A_NEXT can reduce the power consumption associated with the DDS circuit 1100.

Figure 12:
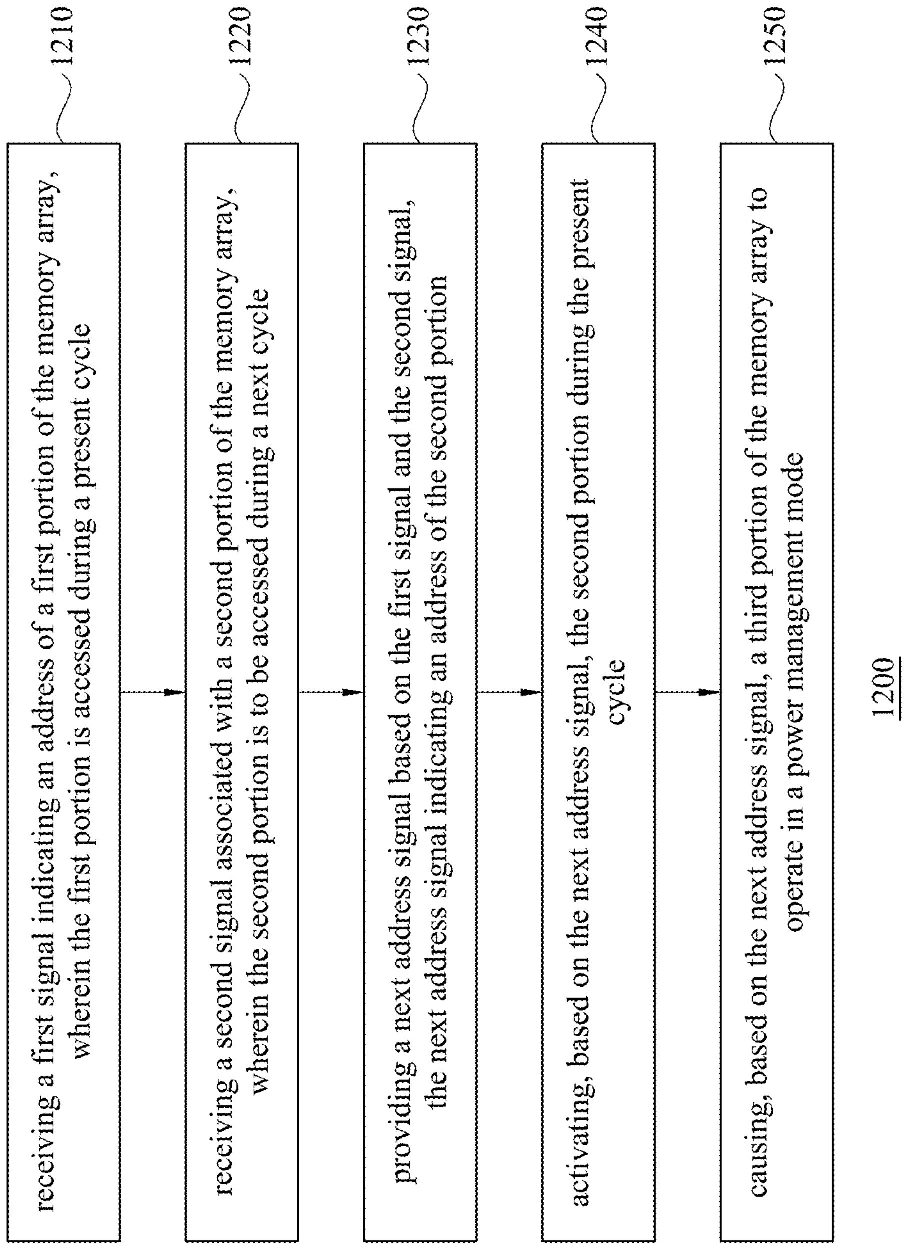
FIG. 12 depicts a flowchart of an example method of a memory circuit, in accordance with some embodiments.

FIG. 12 depicts a flowchart of an example method 1200 of a memory circuit, in accordance with some embodiments. It is noted that the method 1200 is merely an example and is not intended to limit the present disclosure. Accordingly, it is understood that additional, fewer, or different operations may be in the method 1200 of FIG. 12, additional operations provided before, during, and after the method 1200 of FIG. 12, and that some other operations may only be briefly described herein. In some embodiments, the method 1200 is performed by a circuit (e.g., the memory controller 105, the decoder 130, etc.).

In a brief overview, the method 1200 can begin with operation 1210 of receiving a first signal indicating an address of a first portion of the memory array, wherein the first portion is accessed during a present cycle. The method 1200 can continue to operation 1220 of receiving a second signal associated with a second portion of the memory array, wherein the second portion is to be accessed during a next cycle (e.g., to occur after the present cycle). The method 1200 can continue to operation 1230 of providing a next address signal based on the first signal and the second signal, the next address signal indicating an address of the second portion. The method 1200 can continue to operation 1240 of activating, based on the next address signal, the second portion during the present cycle. The method 1200 can continue to operation 1250 of causing, based on the next address signal, a third portion of the memory array to operate in a power management mode.

At operation 1210, a decoder (e.g., the decoder 130) can receive a first signal (e.g., the address signal ADR) indicating an address of a first portion of a memory array (e.g., a sub-array 120A) (or a memory bank, Bank[0]), wherein the first portion is accessed during a present cycle. At operation 1220, the decoder can receive a second signal (e.g., the FCW signal FCW) associated with a second portion of the memory array (e.g., a sub-array 120B) (or a memory bank, Bank[1]), wherein the second portion is to be accessed during a next cycle to occur after the present cycle.

At operation 1230, the decoder can provide a next address signal (e.g., the next address signal A_NEXT) based on the first signal and the second signal. The next address signal can indicate an address of the second portion. In some embodiments, the decoder can include an adder circuit (e.g., the circuits 232A, 232B). The adder circuit can receive the first signal and the second signal, and then provide a result of adding a value (e.g., the address during the present cycle) in the first signal with a value (e.g., associated with the second portion) in the second signal.

At operation 1240, a decoder (e.g., the decoder 130) can activate, based on the next address signal, the second portion during the present cycle. The decoder enable, based on the next address signal, the second portion to operate in a stand-by mode during the present cycle, while the first portion is accessed during the present cycle. At operation 1250, the decoder can cause, based on the next address signal, a third portion of the memory array to operate in a power management mode. The decoder can cause all the portions of the memory array, except for the first portion that is accessed during the present cycle and the second portion that is to be accessed during the next cycle, to operate in the power management mode. In the power management mode of a memory bank, the memory bank can remain deactivated while configured to be activated within one or more cycles.

In some embodiments, the decoder and/or the memory controller can control a charge recycling circuit (e.g., the charge recycling circuit 500) to transfer a charge from a first memory bank (e.g., Bank a of FIG. 5) to a second memory bank (e.g., Bank b of FIG. 5). The charge can be used to activate the second memory bank, thereby reducing the power needed to activate the second memory bank. This provides a simple and flexible solution to effectively reduce the power consumption, while applicable for various memory devices (e.g., Read-Only Memories (ROMs), Random-Access Memories (RAMs), etc.). In some embodiments, the decoder and/or the memory controller can control a detector circuit (e.g., the detector circuit 805) to detect and/or address a prediction failure. The detector circuit can set an output of a FCW signal FCW to a fixed value (e.g., "0") or determine the output from a next address signal in a present cycle to prevent discontinuity.

One aspect of this disclosure is directed to a memory circuit. The memory circuit includes a memory array including a plurality of memory cells, wherein a first portion of the memory array is accessed during a present cycle, and a second portion of the memory array is to be accessed during a next cycle to occur after the present cycle. The memory circuit includes a decoder configured to provide a next address signal indicating an address of the second portion, and a memory controller operatively coupled to the memory array and the decoder, wherein the decoder is configured to activate, based on the next address signal, the second portion during the present cycle, and cause, based on the next address signal, a third portion of the memory array to operate in a power management mode.

Another aspect of this disclosure is directed to a memory circuit. The memory circuit includes a memory array including a plurality of memory cells, wherein a first portion of the memory array is accessed during a present cycle, and a second portion of the memory array is to be accessed during a next cycle to occur after the present cycle. The memory circuit includes a decoder, including at least one adder, configured to receive a first signal indicating an address of the first portion and a second signal associated with the second portion, and provide a next address signal based on the first signal and the second signal, the next address signal indicating an address of the second portion. The memory circuit includes a memory controller operatively coupled to the memory array and the decoder, wherein the decoder is configured to activate, based on the next address signal, the second portion during the present cycle, and cause, based on the next address signal, a third portion of the memory array to operate in a power management mode.

Another aspect of this disclosure is directed to a method of a memory circuit, the memory circuit including a memory array including a plurality of memory cells. The method includes receiving a first signal indicating an address of a first portion of the memory array, wherein the first portion is accessed during a present cycle, receiving a second signal associated with a second portion of the memory array, wherein the second portion is to be accessed during a next cycle to occur after the present cycle, providing a next address signal based on the first signal and the second signal, the next address signal indicating an address of the second portion, activating, based on the next address signal, the second portion during the present cycle, and causing, based on the next address signal, a third portion of the memory array to operate in a power management mode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit, comprising:

a memory array comprising a plurality of memory cells, wherein a first portion of the memory array is accessed during a present cycle, and a second portion of the memory array is to be accessed during a next cycle to occur after the present cycle;

a decoder configured to provide a next address signal indicating an address of the second portion; and a memory controller operatively coupled to the memory array and the decoder, wherein the decoder is configured to:

activate, based on the next address signal, the second portion during the present cycle; and cause, based on the next address signal, a third portion of the memory array to operate in a power management mode.

2. The memory circuit of claim 1, wherein in the power management mode, the third portion of the memory array is deactivated and is configured to be activated within one or more cycles in response to receiving an address signal indicating an address of the third portion.

3. The memory circuit of claim 1, wherein the next address signal indicates the address of the second portion and an address of a fourth portion of the memory array, and wherein the decoder is further configured to activate, based on the next address signal, the fourth portion during the present cycle.

4. The memory circuit of claim 1, further comprising a charge recycling circuit operatively coupled to or included in the memory array, the charge recycling circuit configured to:

receive a charge from the first portion; and provide the charge to a fourth portion through a conductive line, wherein the decoder is configured to activate the fourth portion based on the charge received from the first portion.

5. The memory circuit of claim 1, wherein the decoder is further configured to turn off the power management mode based on a frequency at which the third portion is activated and deactivated.

6. The memory circuit of claim 5, wherein the next address signal includes a threshold value below or above which the decoder is configured to turn off the power management mode.

7. The memory circuit of claim 1, wherein the decoder further comprises a logic circuit configured to compare the address of the second portion indicated in the next address signal with an address of an attempted memory portion of the memory array, the attempted memory portion being attempted to be accessed during the next cycle.

8. The memory circuit of claim 7, wherein the logic circuit comprises a comparator.

9. The memory circuit of claim 7, further comprising an input output (IO) interface, wherein the memory controller is configured to, in response to a detection of a mismatch between the address of the second portion and the address of the attempted memory portion, cause the IO interface to output a predetermined value.

10. The memory circuit of claim 7, wherein the decoder is configured to, in response to a mismatch between the address of the second portion and the address of the attempted memory portion, prioritize the address of the second portion over the address of the attempted memory portion.

11. The memory circuit of claim 1, wherein the memory array is part of a numerical controlled oscillator (NCO) or a direct digital synthesizer (DDS).

12. A method of operating a memory circuit, the memory circuit including a memory array including a plurality of memory cells, the method comprising:

receiving a first signal indicating an address of a first portion of the memory array, wherein the first portion is accessed during a present cycle;

receiving a second signal associated with a second portion of the memory array, wherein the second portion is to be accessed during a next cycle to occur after the present cycle;

providing a next address signal based on the first signal and the second signal, the next address signal indicating an address of the second portion;

activating, based on the next address signal, the second portion during the present cycle; and causing, based on the next address signal, a third portion of the memory array to operate in a power management mode.

13. The method of claim 12, wherein the next address signal indicates the address of the second portion and an address of a fourth portion of the memory array, the method further comprising activating, based on the next address signal, the fourth portion during the present cycle.

14. The method of claim 12, further comprising:

receiving, by a charge recycling circuit operatively coupled to or included in the memory array, a charge from the first portion; and activating, by the charge recycling circuit, the second portion based on the charge received from the first portion.

15. A memory circuit, comprising:

a memory array comprising a plurality of memory cells, wherein a first portion of the memory array is accessed during a present cycle, and a second portion of the memory array is to be accessed during a next cycle to occur after the present cycle; and a decoder configured to:

activate, based on a next address signal indicating an address of the second portion, the second portion during the present cycle; and cause, based on the next address signal, a third portion of the memory array to operate in a power management mode.

16. The memory circuit of claim 15, wherein in the power management mode, the third portion of the memory array is deactivated and is configured to be activated within one or more cycles in response to receiving an address signal indicating an address of the third portion.

17. The memory circuit of claim 15, wherein the next address signal indicates the address of the second portion and an address of a fourth portion of the memory array, and wherein the decoder is further configured to activate, based on the next address signal, the fourth portion during the present cycle.

18. The memory circuit of claim 15, further comprising a charge recycling circuit operatively coupled to or included in the memory array, the charge recycling circuit configured to:

receive a charge from the first portion; and provide the charge to a fourth portion through a conductive line, wherein the decoder is configured to activate the fourth portion based on the charge received from the first portion.

19. The memory circuit of claim 15, wherein the decoder is further configured to turn off the power management mode based on a frequency at which the third portion is activated and deactivated, and wherein the next address signal includes a threshold value below or above which the decoder is configured to turn off the power management mode.

20. The memory circuit of claim 15, wherein the decoder further comprises a logic circuit configured to compare the address of the second portion indicated in the next address signal with an address of an attempted memory portion of the memory array, the attempted memory portion being attempted to be accessed during the next cycle.

* * * * *